United States Patent [19]

Hidaka

[11] Patent Number: 4,731,752

[45] Date of Patent: Mar. 15, 1988

[54] BLOCH LINE MEMORY DEVICE WITH STRIPE DOMAIN STABILIZING MEANS

[75] Inventor: Yasuharu Hidaka, Tokyo, Japan

[73] Assignee: NEC Corporation, Tokyo, Japan

[21] Appl. No.: 852,280

[22] Filed: Apr. 15, 1986

[30] Foreign Application Priority Data

Apr. 15, 1985 [JP] Japan .................................. 60-79659
Apr. 25, 1985 [JP] Japan .................................. 60-89321

[51] Int. Cl.$^4$ ............................................. G11C 19/08
[52] U.S. Cl. ....................................... 365/29; 365/15;
365/37; 365/87
[58] Field of Search ......................... 365/29, 37, 15, 87

[56] References Cited

U.S. PATENT DOCUMENTS 3,913,079 10/1975 Rosier .................................... 365/37
4,583,200 4/1986 Konishi et al. ......................... 365/29

Primary Examiner—James W. Moffitt
Attorney, Agent, or Firm—Sughrue, Mion, Zinn, Macpeak & Seas

[57] ABSTRACT

In a Bloch-line memory wherein a magnetic film comprises a first and a second major line and a minor loop portion defined between the first and second major lines, successive presence and absence of magnetic bubbles being transferred along the first major line in response to a plurality of information signals, the information signals being memorized as vertical Bloch line pairs in domain walls of stripe-domains generated in the minor loop portion, the memorized vertical Bloch line pairs being propagated towards the second major line and being read out as bubbles into the second major line, the magnetic film is formed with a plurality of endless long grooves at desired locations in the minor loop portion and an endless stripe-domain is generated and stabilized in each endless long groove, so that the propagation of vertical Bloch line pairs can be performed step by step. The magnetic film is further formed with a first and a second groove on both sides of the minor loop portion, and a first and a second connecting grooves to connect each endless groove to the first and second grooves on which the first and second major lines are disposed. The write-in operation and the read-out operation are performed by partially expanding the endless stripe-domain into corresponding one of the first and second connecting grooves and by carrying out the domain chopping technique therein.

10 Claims, 35 Drawing Figures

BLOCH LINE MEMORY DEVICE WITH STRIPE DOMAIN STABILIZING MEANS

BACKGROUND OF THE INVENTION

1. Field of the Invention

The present invention relates to a magnetic memory device for magnetically memorizing information by the use of magnetic domains generated in a magnetic medium having an easy axis of magnetization orthogonal to a principal surface thereof and, in particular, to a so called Bloch line memory device using vertical Bloch-lines (VBLs) in stripe-domain walls as logic units of information.

2. Description of the Prior Art

As a magnetic memory device using the magnetic domains, a magnetic bubble memory device has been well known in the prior art wherein magnetic bubbles, namely, cylindrical domains are used as magnetic domains and transferred along predetermined propagation patterns by application of magnetic field.

Recently, the Bloch-line memory device has been proposed by Konishi and Hidaka as disclosed in EP-A-0106358 (which is corresponding to copending U.S. application Ser. No. 542,963 filed on Oct. 18, 1983 and now U.S. Pat. No. 4,583,200 by Konishi and Hidaka and assigned to the same assignee of the present application).

The Bloch-line memory device enables one to provide a memory device having an extremely high memory density in comparison with the conventional magnetic bubble memory device.

As disclosed in EP-A-0106358, the Bloch-line memory device comprises a magnetic medium, such as a garnet film, having an easy axis of magnetization orthogonal to a principal surface thereof. In the magnetic medium surface, at least one magnetic domain is generated in a stripe shape having opposite ends. The stripe-domain is surrounded by a domain wall laid in parallel with the easy axis of magnetization. The domain wall has wall magnetization along the domain wall. An information signal is written into the domain wall at one end portion of the stripe-domain in a form of a pair of vertical Bloch lines. The VBL pair is detected at the other end to produce a read-out signal. In order to propagate or transfer the VBL pair from the write-in end to the read-out end, pulsed magnetic field is applied to the magnetic film.

The reliable step-by-step propagation of the VBL by application of the pulsed magnetic field requires an improvement of the stripe-domain stabilization.

SUMMARY OF THE INVENTION

It is an object of the present invention to provide a Bloch-line memory device wherein a stripe-domain is readily generated and stabilized at a fixed position in the magnetic medium.

It is another object of the present invention to provide the Bloch-line memory device having an arrangement for readily erasing VBL pairs in the domain wall and writing VBL pairs into the domain wall, as well as reading out the VBL pairs in the domain wall.

The present invention is applicable to a Bloch-line memory device wherein a plurality of information signals is memorized in domain walls of stripe-domains generated in a magnetic medium having an easy axis of magnetization orthogonal to the principal surface and by the use of VBL pairs in the domain walls as logic units of information, the information signals as memorized being read-out in the non-destructive manner. According to the present invention, at least one endless ring-like groove is formed in the principal surface to leave an island portion defined inside the endless groove so that said island portion is surrounded by an endless step portion at an inner boundary of the endless groove. A stripe-domain generating means is provided for controllably generating the stripe-domain in a form of an endless ring within the endless groove. The endless stripe-domain has an inner domain wall fixedly disposed under the step portion to thereby stabilize the endless stripe-domain. The endless stripe-domain is surrounded by an outer domain wall in which the VBL pairs are written according to the information signals to be memorized. The VBL pairs are transferred in the outer domain wall by application of the propagation magnetic field on the magnetic film.

In one aspect of the present invention, the endless groove comprises a first and a second circular end portion and two intermediate portions extending in parallel with each other between the first and second circular end portions. The island portion is in a form of a stripe shape.

The groove has a width dimension which is larger than $W_0$ but smaller than $2W_0$. $W_0$ is a width dimension of a natural stripe-domain which exists in the magnetic medium when no magnetic field is applied to the magnetic medium. The stripe-shape island portion has a width dimension larger than $W_0$.

The write-in means comprises a first major line groove being formed in the magnetic medium adjacent the first circular end portion and with a first space left between the first major line groove and the first circular end portion, a first connecting groove being formed in the first space and connecting the first major line groove and the first circular end portion, means responsive to each of the information signals for selectively disposing a magnetic bubble in the major line groove and at a predetermined position in front of the first connecting groove, and Bloch line writing means for writing a first vertical Bloch line pair into the outer domain wall through the first connecting groove only when no magnetic bubble is disposed at the predetermined position.

The Bloch-line memory device further comprises erasing means for erasing the vertical Bloch line pair from the outer domain wall through said first connecting groove. The Bloch-line memory device further comprises a second major line groove being formed in the magnetic medium adjacent the second circular end portion and with a second space left between the second major line groove and the second circular end portion, a second connecting groove being formed in the second space and connecting the second major line groove and the second circular end portion, and the detecting means for detecting each of the vertical Bloch line pairs through the second connecting groove.

DETAILED DESCRIPTION OF PREFERRED EMBODIMENT

Figure 1:
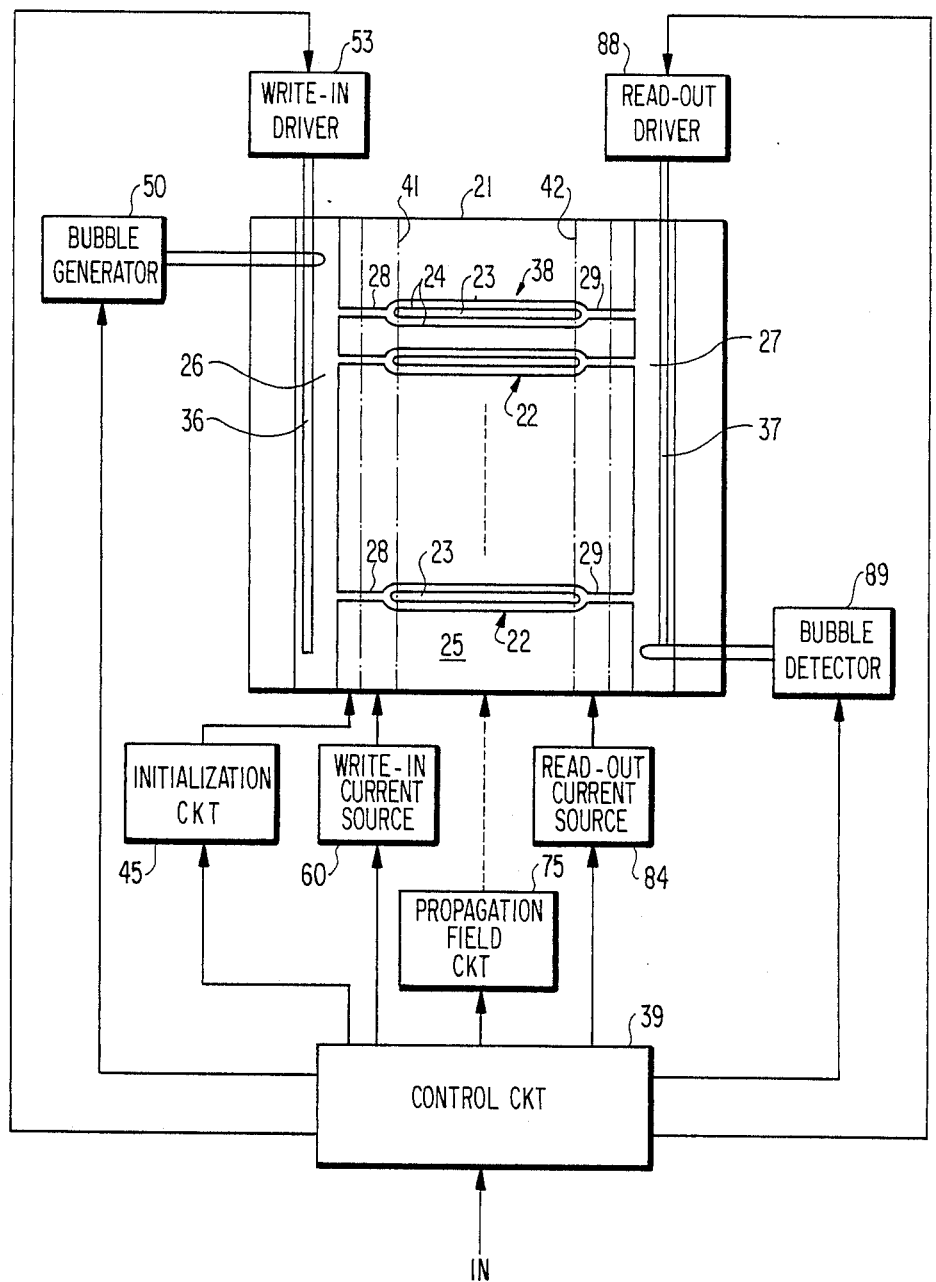
FIG. 1 is a schematic block circuit view illustrating a Bloch line memory device according to an embodiment of the present invention.
Figure 2:
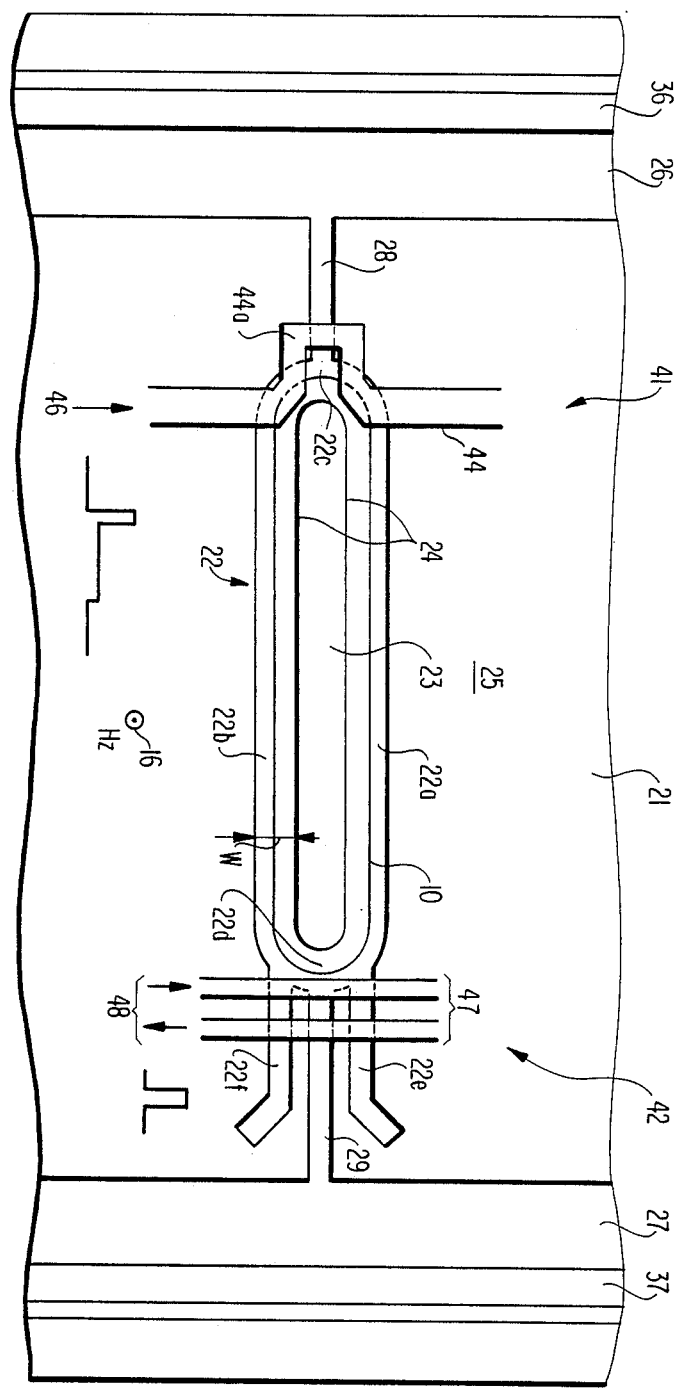
FIG. 2 is a plan view of a position of a magnetic film used in FIG. 1, for explaining an endless stripe-domain generating means.

FIG. 1 shows a general arrangement of a Bloch line memory device according to an embodiment of the present invention, which is similar to the arrangement shown in FIG. 2 of EP-A-0106358.

Referring to FIG. 1, the shown embodiment comprises a magnetic medium or film 21 such as a garnet layer having a principal surface directed upwards of FIG. 1 and an easy axis of magnetization orthogonal to the principal surface.

The magnetic film is formed with a pattern of grooves in the principal surface and therefore, has thickness variation, as will later be described.

The magnetic memory device comprises, on the magnetic medium 21, first and second major lines 36 and 37 placed at first and second predetermined positions, respectively, and a minor loop portion 38 laid between the first and the second predetermined positions. The minor loop portion 38 is for storing each of information signals. The first major line 36 is operable to write each of the information signals in the minor loop portion 38 while the second major line 37 is operable to read each information signal out of the minor loop portion 38. Each of the first and the second major lines 36 and 37 is driven by a dual conductor pattern driving method. A first conductor portion 41 is laid along the first major line 36 with a first spacing left between the first conductor portion 41 and the first major line 36. A second conductor portion 42 is laid along the second major line 37 with a second spacing left between the second conductor portion 42 and the second major line 37.

The Bloch line memory device further comprises an initialization circuit 45, a bubble generator 50, a write-in driver 53, a write-in current source 60, a propagation field circuit 75, a read-out current source 84, a read-out driver 88, and a bubble detector 89, which are driven under control of a control circuit 39 to carry out formation of stripe-domains, write-in operation, propagation of VBL pairs, and read-out operation under control of the control circuit 39 in a manner generally similar to that in the memory device in EP-A-0106358.

Now, description is made as to the pattern of grooves in the magnetic medium as described above.

Figure 3:
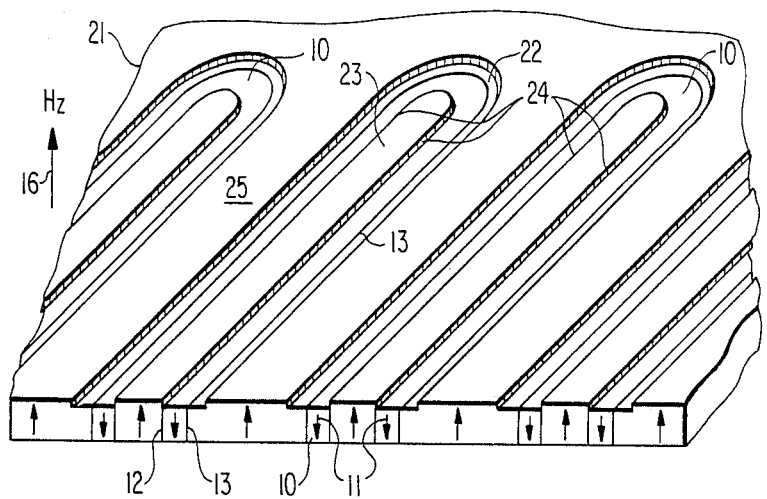
FIG. 3 is a perspective view of a portion of the magnetic film.

Referring to FIG. 1 again and FIGS. 2 and 3, a plurality of endless, or ring-like grooves 22 is formed in the minor loop portion 38 of the magnetic film 21, and is located at positions where the stripe-domains are desired to be formed.

Each endless groove 22 comprises two groove portions 22a and 22b parallelly extending in a lateral direction in FIG. 1 and a first and a second semicircular groove portions 22c and 22d positioned adjacent first and second major lines 36 and 37, respectively. Those two groove portions 22a and 22b are connected to the first and second semicircular groove portions 22c and 22d to form the endless groove 22, so that an island 23 of a stripe shape is left inside the endless groove 22 and defined by an endless inner wall 24.

The magnetic medium is further formed with a first and a second groove 26 and 27 at positions where the first and the second major lines 36 and 37 are located, respectively, so that the first and the second major lines 36 and 37 are formed in the first and the second grooves 26 and 27.

In order to connect each endless groove 22 with the first and the second grooves 26 and 27, a first and a second connecting groove 28 and 29 is further formed in the principal surface of the magnetic film 21. That is, the first and the second connecting grooves 24 and 25 laterally extend from central portions of the first and the second semicircular groove portions 22c and 22d in opposite directions and connect to the first and the second grooves 26 and 27, respectively. Those connecting grooves 28 and 29 are not shown in FIG. 3 for simplification of the drawing.

The magnetic film 21 is further provided with two extension groove portions 22e and 22f of two parallel groove portions 22a and 22b, as shown in FIG. 2. That is, two extension groove portions 22e and 22f are on extension lines of the two parallel groove portions 22a and 22b, respectively, and laterally extend from the second semicircular groove portion 22d towards, but short of, the second groove 27. Those extension grooves 22e and 22f are not shown in FIGS. 1 and 3, for simplification of the drawing.

Thus, the magnetic medium 21 is provided with a pattern of grooves comprising a plurality of endless grooves 22, the first and the second grooves 26 and 27, the first and the second connecting grooves 28 and 29 and two extension grooves, which are connected to one another.

The pattern of grooves can be formed by means of, for example, ion-milling.

The formation of the groove pattern makes thickness variation in the magnetic medium 21, so that the thickness of the groove-pattern region is smaller than that of the non-milled region, that is, the island 23 and the remaining regions 25 left between those grooves.

Referring to FIG. 2 again, the first conductor portion 41 comprises a hairpin-shaped conductor 44 coated on the principal surface of the magnetic medium, so that each hairpin portion 44a overlies on the semicircular groove portion 22c.

The hairpin-shaped conductor 44 cooperates with the initialization circuit 45 (FIG. 1) to form stripe-domains in respective endless grooves 22. More specifically, a strong magnetic field orthogonal to the principal surface is at first applied upwardly as shown at 16 in FIG. 2 onto the magnetic medium 21 to clear all natural domains from the magnetic medium 21. Then, the magnetic field is slightly reduced and maintained at the slightly reduced strength Hz, which is referred to as a bias magnetic field. An electric pulse current 46 is caused to flow through the hairpin-shaped conductor 44. Then, a bubble domain is generated adjacent hairpin portion 44a in the first semicircular groove portion 22c of each endless groove portion 22, and expands into extension groove portions 22e and 22f through parallel groove portions 22a and 22b to form a U-shaped stripe-domain.

The second conductor portion 42 comprises a pair of conductors 47 laid on the principal surface to cross the parallel extension groove portions 22e and 22f. When an electric pulse current 48 is caused to flow through the conductors 47 in the directions as indicated by arrows, a bubble domain is generated along the conductors 47 and connects the opposite ends of the U-shaped stripe-domain extended in the extension groove portions 22e and 22f to change the U-shaped stripe-domain into an endless or ring-like form. As a result, an endless or ring-like stripe-domain 10 is generated in each endless groove 22.

Referring to FIG. 3, if the bias magnetic field Hz is directed upwardly as indicated by arrow 16, each endless stripe-domain 10 has magnetization directed downwardly as indicated by an arrow 11 while magnetization of the other region surrounding the endless stripe-domains 10 is directed upwardly. Accordingly, the each endless stripe-domain 10 has an inner and an outer endless domain wall 12 and 13.

The endless stripe-domain 10 as generated in the groove 22 is attracted towards the step portion 24 due to the so called domain pinning and due to the surface tension of the domain walls 12 and 13, so that the inner domain wall 12 is positioned under the endless step portion 24, so that the stabilization of each endless stripe-domain 10 is insured.

In this connection, it is preferably required that each endless groove 22 is formed to have a width W larger than a width $W_0$ the natural stripe-domain but smaller than $2W_0$, as shown in FIG. 2. In this arrangement, the inner domain wall 12 is reliably attracted and positioned under the step portion 24, while the outer domain wall 13 is formed in the endless groove region.

In connection with various depths of the groove within dimensional vaules of 5% to 40% of the entire thickness of the magnetic film, it was practically ascertained that the endless stripe-domain could be generated without any problem.

According to the present invention, VBL pairs representing logic units of information are written in the outer endless domain wall 13 of each endless magnetic domain 10, propagated therein and read out from the endless domain wall 13. As described above, since the endless magnetic domain 10 is stabilized in the magnetic film 21 so that the inner domain wall 12 is positioned under the endless step portion 24, the step-by-step propagation of VBL pairs is reliably performed by applying the pulsed magnetic field onto the magnetic film 21 in the direction of the bias magnetic field Hz in the similar manner as described in EP-A-0106358.

Now, description is made as to arrangements for writing information signal into the outer domain wall 13 and for reading out the information signal from the domain wall 13.

Figure 4:
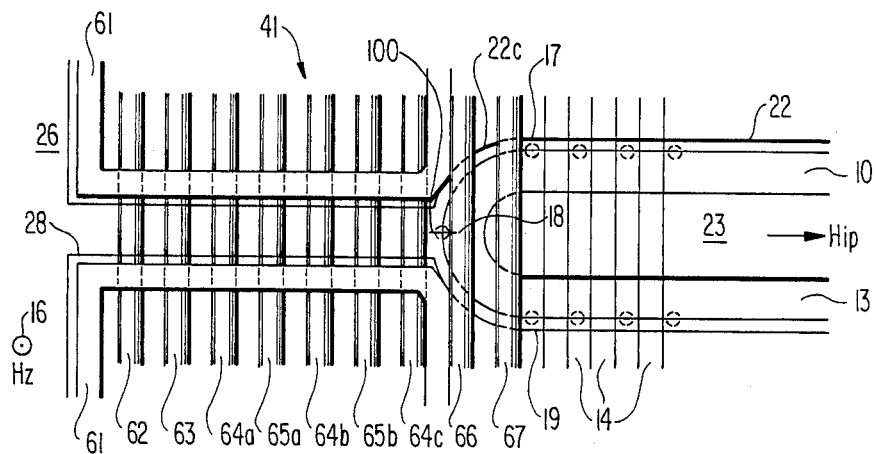
FIG. 4 is a plan view of a portion of the magnetic film for illustrating a conductor arrangement for information erasing and write-in operations.

Referring to FIG. 4, first conductor portion 41 comprises two U-shaped conductors 61 laid in parallel with the first connecting groove 28, and nine parallel conductors 62-67 laid adjacent the first groove 26 at which the first major line 36 is formed. The U-shaped conductors 61 are for causing an electric current flowing therethrough so as to expand or extend the magnetic domain 10 into the first connecting groove 28 from the endless groove 22. Seven conductors 62, 63, 64a-64c, 65a and 65b extend in parallel with one another intersecting the first connecting groove 28, as shown in the figure. The conductor 62 adjacent the first groove 26 of the major line 36 is for causing an electric current flowing therethrough so as to prevent the extended endless stripe-domain 10 from projecting into the first groove 26 from the first connecting groove 28. Conductor 63 is positioned adjacent the domain projection preventing conductor 62 and is for causing an electric current flowing therethrough so as to trap a VBL in the outer domain wall 13 of the endless stripe-domain 10 extended into the first connecting groove 28. Conductors 64a, 64b, and 64c are for locally generating magnetic field in the magnetic medium 21 under the conductors in an opposite direction of an inplane magnetic field $H_{ip}$ as described later. The conductor 64a is located adjacent the VBL-trapping conductor 63 and the conductor 64c is located adjacent connection of the first connecting groove 28 and the first semicircular groove portion 22c, while the conductor 64b being located between the conductors 64a and 64b. Conductor 65a is located between conductors 64a and 64b, and conductor 65b is located between conductors 64b and 64c. These conductors 65a and 65b are for causing an electric current flowing therethrough so as to chop a magnetic bubble from the magnetic domain extended into the first connecting groove 28 from the endless groove 22.

Conductors 66 and 67 are laid in the magnetic film 21 to extend through the first semicircular groove portion 22c. The conductor 66 is located adjacent the connecting position of the first connecting groove 28 and the endless groove 22.

In the figure, bit positions in the outer domain wall 13 are shown by dotted-line circles. The bit positions can be formed by the Permalloy patterns on the magnetic film 21 as disclosed in EP-A-0106358, or by the ion-injection technique to form local variations of magnetic anisotropy in the domain wall as disclosed in Japanese Patent Application No. 65826/83 (which was published under Unexamined Patent Publication No. 191189/84). Spacings between adjacent bits are shown at 14.

Three bit positions 17, 18 and 19 are in a circular portion of the outer domain wall 13. The bit position 18 is located adjacent the connecting portion of the first connecting groove 28 and the first semicircular groove portion 22c. The bit positions 17 and 19 are located adjacent the bit position 18 but a both sides of the bit position 18.

Conductor 67 is for causing an electric current flowing therethrough so as to insure bit separation of bit positions 17 and 19 from bit position 18. Conductor 66 is for causing an electric current flowing therethrough so as to restrain a VBL at a position between conductors 66 and 67.

A negative VBL is previously formed at the bit position 18 as shown by a short line 100 and is fixed at the bit position 18 by application of the inplane magnetic field $H_{ip}$ by a known method. If the bias magnetic field Hz is directed upwardly as shown at 16, the inplane magnetic field $H_{ip}$ is directed rightwards as indicated by an arrow in FIG. 4. Under the circumstance, VBL pairs are moved in a counterclockwise direction by application of the pulsed magnetic field as described above.

Next, description is made as to erasing and writing-in operation of a unit of information signal.

At first, the erasing operation is described referring to FIG. 5.

Referring to FIG. 5, it is provided that two VBL pairs are written in bit positions 17 and 18. Each VBL is shown by a short line intersecting the outer domain wall 13. Accordingly, two short lines are shown at the bit position 17, while three lines are drawn at the bit position 18. The three lines represents the VBL pairs and the previously fixedly formed VBL 100 (in FIG. 4).

Figure 5A:
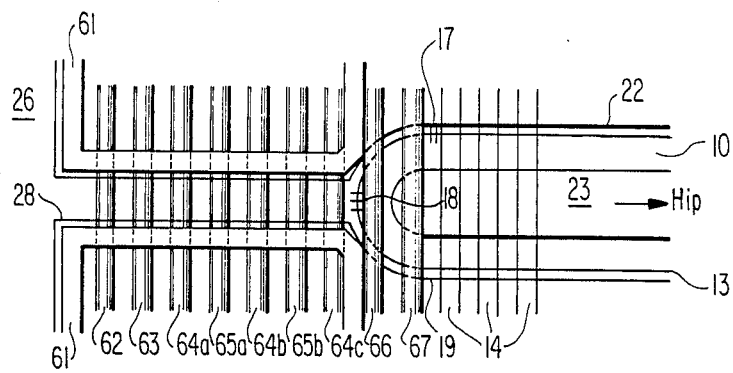
FIGS. 5a–5h are a plan view for use in describing the erasing operation of the conductor arrangement of FIG. 4.
Figure 5B:
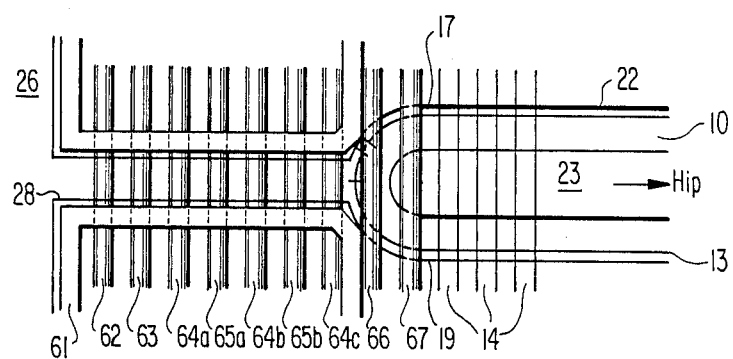

When the pulsed magnetic field is applied to the magnetic medium by the propagation field circuit 75 (FIG. 1), the VBL pairs are shifted in the outer domain wall 13 by one bit, as shown in FIG. 5(b).

Figure 5C:
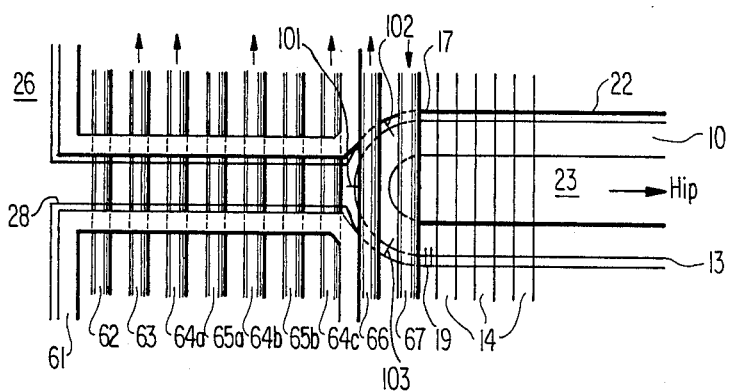

Then, when electric currents are caused to flow through conductors 63, 64a–64c, 66 and 67 by the write-in current source (FIG. 1) as shown by arrows in FIG. 5(c), three VBLs at the bit position 18 are separated from one another so that one VBL 101 is located at a head of the outer domain wall 13. The other VBLs 102 and 103 are shifted towards the bit positions 17 and 19, respectively, by the current flowing through the conductor 66 and are restrained at positions between conductors 66 and 67 due to currents flowing through not only the conductor 66 but also the conductor 67, as shown in FIG. 5(c).

It is noted that the current flowing through conductors 63, 64a–64c, and 66 generates local inplane magnetic field under respective conductors directed opposite to the inplane magnetic field $H_{ip}$. Another local inplane magnetic field is generated under conductor 67 in the direction of the inplane magnetic field $H_{ip}$ by the current flowing through the conductor 67.

Figure 5D:
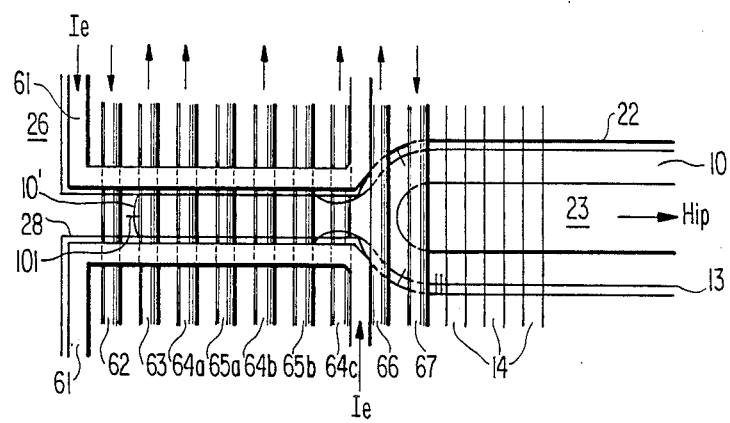

Under the condition, a current is caused to flow through U-shaped conductors 61 by the write-in current source 60 as indicated by arrows $I_e$. As a result, the head portion of the endless stripe-domain 10 is extended into the first connecting groove 28. At the same time, a current is caused to flow through conductor 62 by the write-in current source 60 so that a local inplane magnetic field is generated under the conductor 62 in the direction of the inplane magnetic field $H_{ip}$. Thus, the extension 10' of the magnetic domain is controlled short of a position of the conductor 62 but beyond a position of the conductor 63. Accordingly, the VBL 101 at the head of the outer domain wall 13 is also located at a position between conductors 62 and 63, as shown in FIG. 5(d).

Figure 5E:
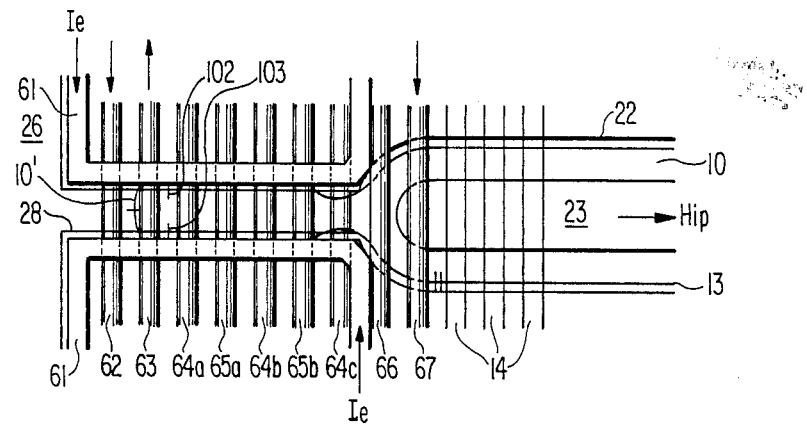

Thereafter, when currents are stopped from flowing through conductors 64a–64c and 66 with currents being maintained to flow through conductors 61, 62, 63, and 67, VBLs 102 and 103 are shifted to positions between conductors 63 and 64a as indicated in FIG. 5(e) because they are freed from restriction by current flowing through conductor 66.

Figure 5F:
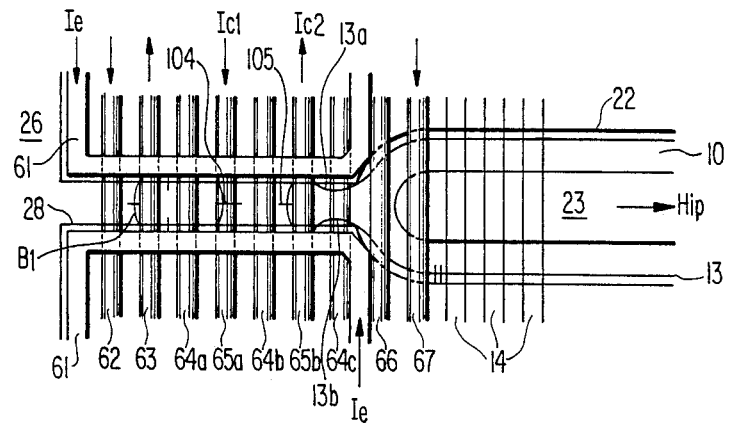

Under the condition, when a current is caused to flow through conductors 65a and 65b in opposite directions as shown at arrows $I_{c1}$ and $I_{c2}$ in FIG. 5(f), the magnetic domain 10' extended into the first connecting groove 28 is separated at a position between the conductors 65a and 65b, so that a magnetic bubble $B_1$ is chopped out of the magnetic domain 10'. The magnetic bubble $B_1$ has the VBLs 101–103 and a fresh VBL 104 generated by chopping of the magnetic bubble. The remaining extension of magnetic domain 10' after chopping also has a VBL 105 generated by the chopping at the head position, as shown in FIG. 5(f).

Figure 5G:
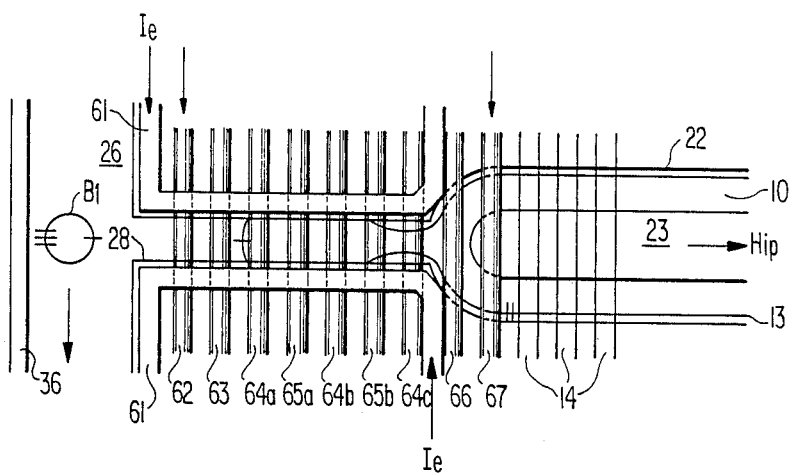

Thereafter, currents are stopped from flowing through conductors 62, 63, 65a and 65b while maintaining the currents flowing through conductors 61 and 67. As a result, the magnetic bubble $B_1$ is pushed out from the first connecting groove 28 into the first groove 26 of the first major line 36 due to repulsion force acting between the magnetic bubble $B_1$ and the magnetic domain extension 10', as shown in FIG. 5(g). At the time, the magnetic domain extension 10' does not retract into endless groove 22 even by the repulsion force because the outer domain wall 13 has reversed curvature portions 13a and 13b at connection point of the magnetic domain extension 10' and the endless stripe-domain 10. The magnetic domain extension 10' remaining after chopping again extends towards the first groove 26. Then, the current is caused to flow through conductor 62 so that the extension of the magnetic domain is prevented from projection into the first groove 26. The magnetic bubble $B_1$ is transferred in the first groove 26 along the major line 36.

Figure 5H:
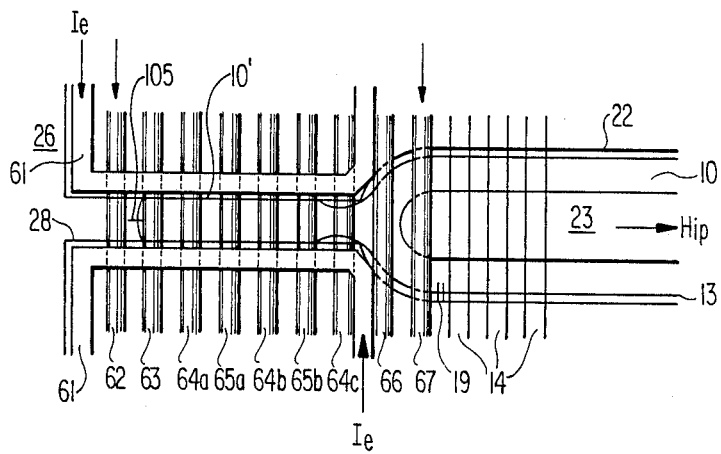

Thus, the VBL pair as written in the bit position 17 in FIG. 5(a) is erased as shown in FIG. 5(h).

Next, the write-in operation is described below.

Referring to FIG. 1, the bubble generator 50 generates a succession of magnetic bubbles in first groove 26 to send the same along the first major line 36. Presence and absence of the magnetic bubbles are controlled by the control circuit 39 in response to each of the information signals (depicted at IN in FIG. 1) to be written in each stripe-domain 10.

Figure 6A:
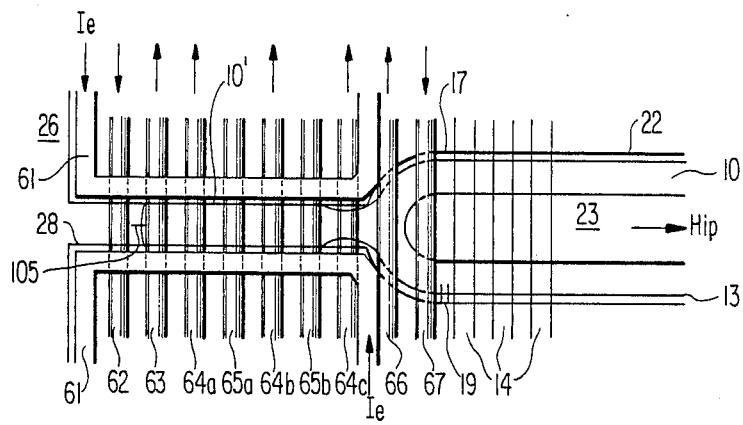
FIGS. 6a–6g are a plan view for use in describing a write-in operation of the conductor arrangement of FIG. 4.

Under the condition as shown in FIG. 5(h) where no bubble exists at a position in the first groove 26 of the first major line 36 in front of the first connecting groove 28 and the magnetic domain extension 10' extends towards the first groove 26 but short of the position of conductor 62, currents are caused to flow through conductors 63, 64a–64c, and 66, and at the same time, a pulse current is applied to the conductor 62 in the direction of the current which flows therethrough, as shown in FIG. 6(a).

Figure 6B:
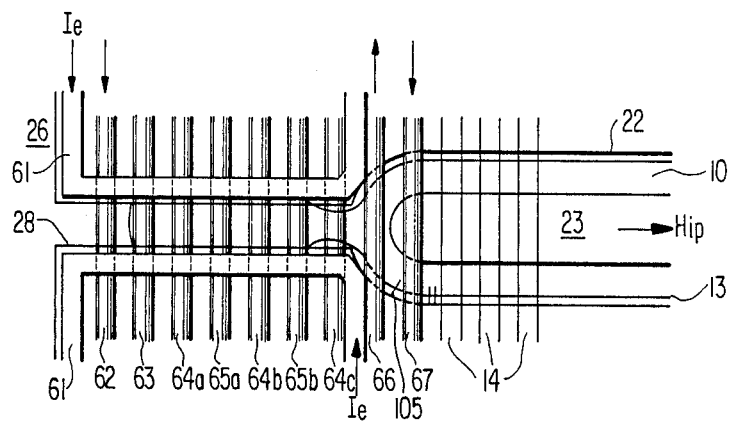

As a result, the VBL 105 is shifted from the head of the magnetic domain extension 10' to a position between conductors 66 and 67 and is restricted thereat, as shown in FIG. 6(b). Then, the currents are stopped from flowing through conductors 63, 64a, 64b, and 64c.

Figure 6C:
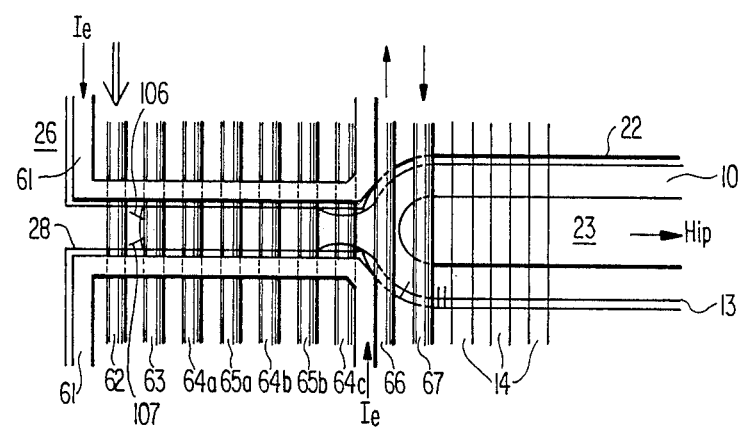
Figure 6D:
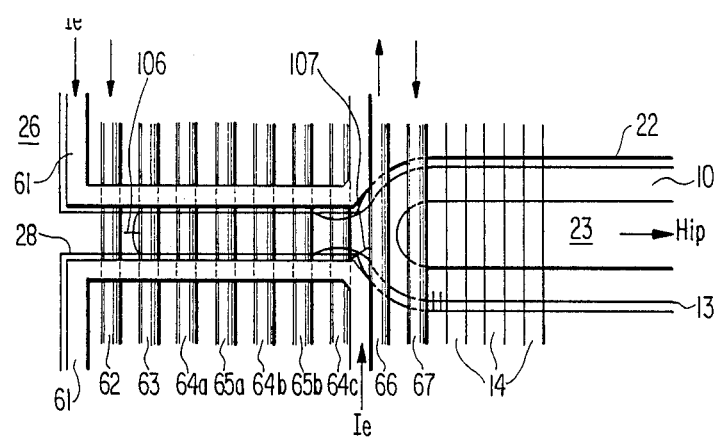

Thereafter, an intensive pulse current is applied to the conductor 62, so that a positive and a negative VBL 106 and 107 are written into the head position of the domain wall 13 of the magnetic domain extension 10', as shown in FIG. 6(c). The positive VBL 106 is stabilized at the head position by the inplane magnetic field $H_{ip}$, while the negative VBL 107 is shifted to a position adjacent the conductor 66, as shown in FIG. 6(d).

Figure 6E:
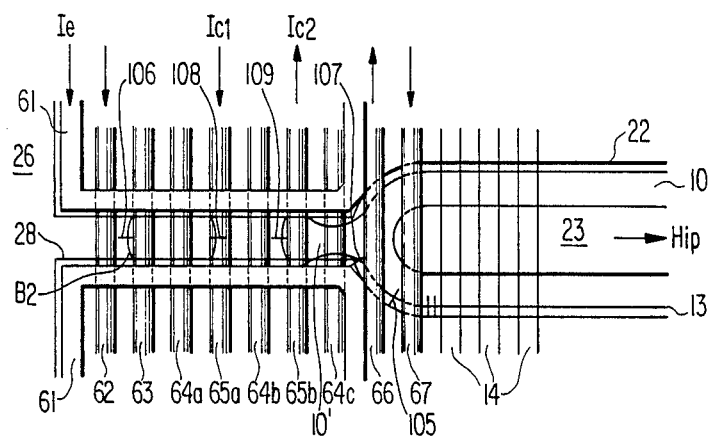

Under the condition, currents $I_{c1}$ and $I_{c2}$ of opposite directions are applied to conductors 65a and 65b. As a result, the magnetic domain extension 10' is chopped out in the similar manner as described above, so that a bubble $B_2$ is generated to the VBL 106 and a freshly generated VBL 108. The magnetic domain extension 10' remaining after chopping has a new VBL 109, as shown in FIG. 6(e).

Figure 6F:
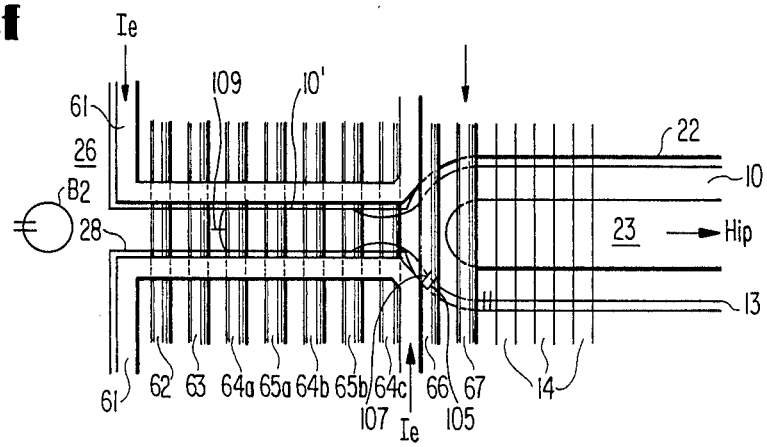

Then, currents are stopped from flowing through conductors 62, 65a, 65b, and 66. As a result, the bubble $B_2$ is pushed out into the first groove 26 from the first connecting groove 28 and the remaining magnetic domain extension 10' extends towards the first groove 26 as shown in FIG. 6(f), in the similar manner as described above in connection with FIGS. 5(f) and 5(g). At the same time, the VBL 107 and the VBL 105 are combined to form a VBL pair as shown in FIG. 6(f), because the current is stopped from flowing through the domain restriction conductor 66.

Figure 6G:
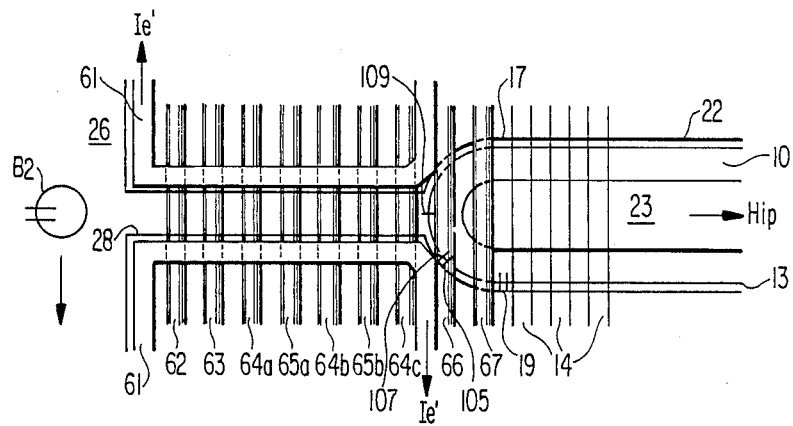

Then, the current applied to U-shaped conductors 61 is reversed in the flowing direction as indicated by arrows Ie' and Ie', so that the magnetic domain extension 10' is retracted into the endless groove 22, as shown in FIG. 6(g). Under the condition, three VBLs 109, 107 and 105 exist in the bit position 18. Thus, one VBL pair of 107 and 105 is written into the outer domain wall 13. Then, the current flowing through the conductor 67 is stopped.

The bubble B₂ is transferred in the first groove 26 of the major line 36.

Figure 7A:
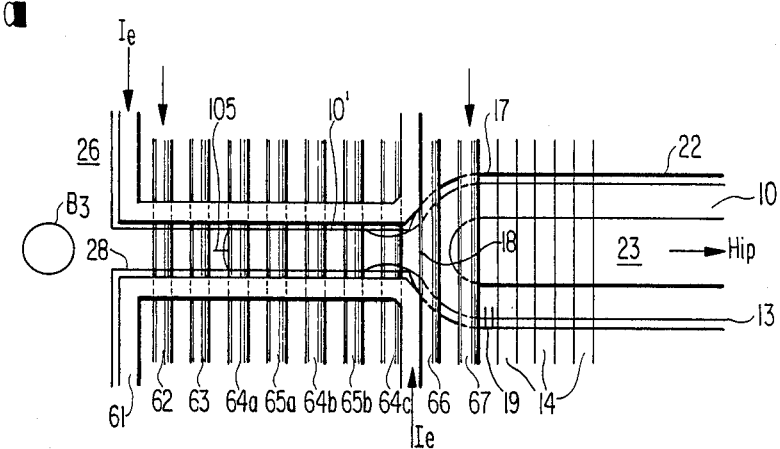
FIGS. 7a–7c are a plan view for use in describing another write-in operation of the conductor arrangement of FIG. 4.

Next, another writing operation is described as to a case where one bubble B₃ is positioned, as shown in FIG. 7(a), in the major line 36 in front of the first connection groove 28 under the condition of FIG. 5(h).

In the condition of FIG. 7(a), the head of the magnetic domain extension 10' is retracted by the repulsion force from the bubble B₃ to be away from the conductor 62.

Figure 7B:
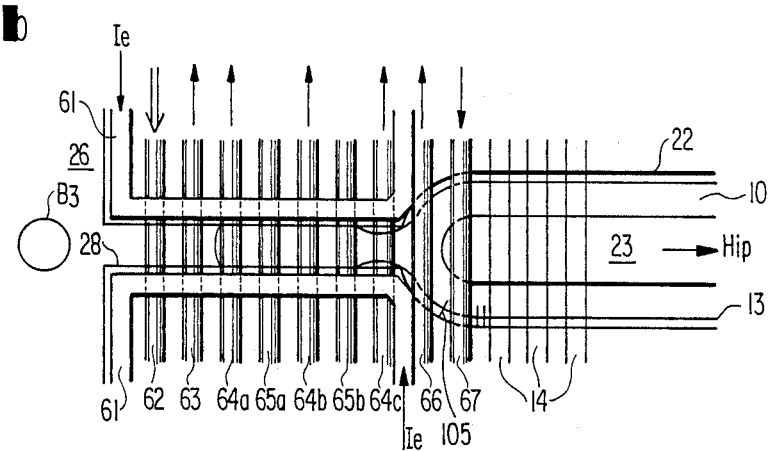
Figure 7C:
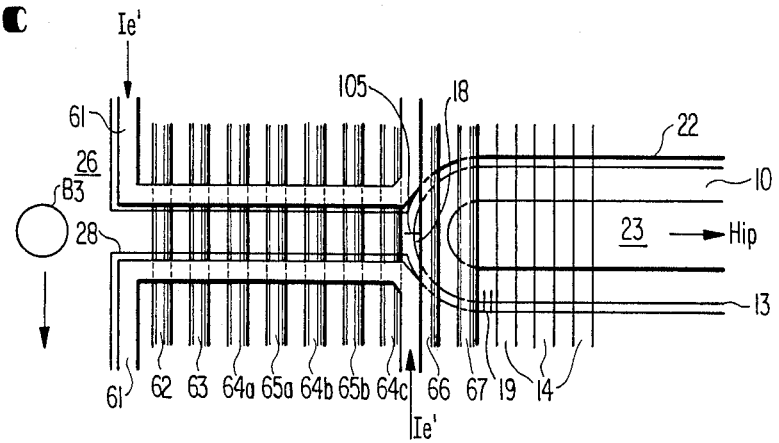

Under the condition, when currents are applied to conductors 63, 64a–64c, and 66, and at the same time, a pulse current is applied to the conductor 62 in the direction of the current which flows therethrough, the VBL 105 is shifted to the right side position of the conductor 66 and is stabilized thereat, as shown in FIG. 7(b). However, no VBL is written into the domain wall 13, even when the successive pulse current is applied in the same manner as shown in FIG. 6(c).

As a result, no VBL exists in the outer domain wall of the magnetic domain extension 10'. Accordingly, neither bubble is chopped out from the domain extension 10' nor VBL is generated in the outer domain wall of the domain extension 10' even if currents are selectively applied to conductors 62–66 in the similar manner as described above in connection with FIGS. 6(d) to 6(f).

Then, the current applied to the U-shaped conductors 61 is reversed in the direction as indicated by arrows Ie' in FIG. 6(c), the magnetic domain extension 10' is retracted into the endless groove 22. In the condition, only one VBL 105 exists in the bit position 18 in the outer domain wall 13 of the endless magnetic domain 10. Thus, no VBL pair is written into the domain wall 13. That is, the logic "1" is written into the bit position 18 if the bubble in the major line represents the logic "1".

Next, description is made as to an arrangement for reading out the information signals written in the outer domain wall 13 to the second major line 37.

Figure 8:
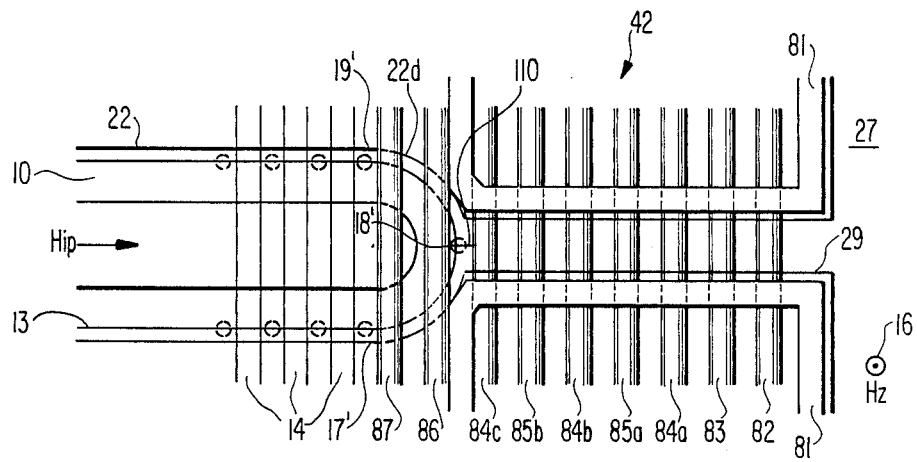
FIG. 8 is a plan view of a portion of the magnetic film for illustrating another conductor arrangement for information read-out operation.

Referring to FIG. 8, the second conductor portion 42 comprises two U-shaped conductors 81 and nine parallel conductors 82-87. Since an arrangement of those conductors 81-87 is symmetric with the arrangement of conductors 61-67 in FIG. 4, description thereto is omitted for the purpose of simplification of the description. It is only described that the second groove 27, the second connecting groove 29, the second semicircular groove portion 22d, and the conductors 81-87 are corresponding to the first groove 26, the first connecting groove 28, the first semicircular groove portion 22c, and the conductors 61-67, respectively.

Three bit positions are located in the second semicircular groove 22d as shown at 17', 18', and 19' in FIG. 8, and a negative VBL 110 is previously generated at the central bit position 18' and fixed by the inplane magnetic field $H_{ip}$ in the similar manner as in FIG. 4.

Now, the reading out operation is described referring to FIG. 9.

Figure 9A:
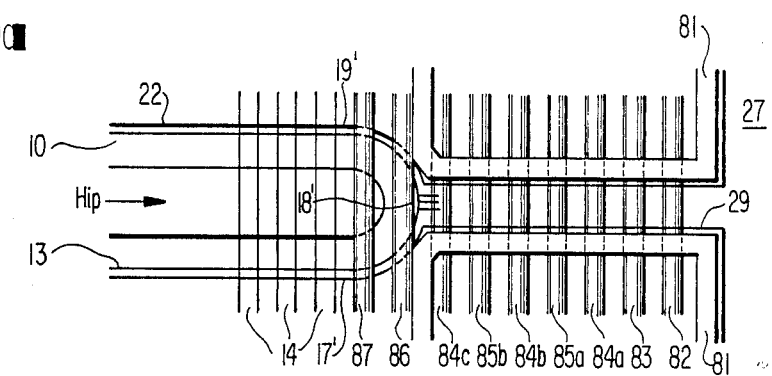
FIGS. 9a–9f are a plan view for use in describing a read-out operation of the conductor arrangement of FIG. 8.

In a condition as shown in FIG. 9(a), it is assumed that one pair of VBL is written into the bit position 18'. So that three VBLs including the previously generated VBL 110 exist in the bit position 18', while no VBL pair is written into respective bit positions 17' and 19'.

Figure 9B:
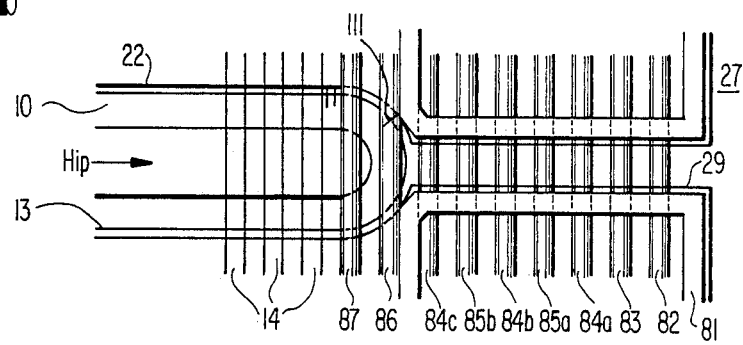

Under the circumstance, when the propagation field is applied to the magnetic film, the VBL pair shifts to the bit position 19' from the bit position 18', as shown in FIG. 9(b), the other VBL 111 is maintained in the bit position 18'.

Figure 9C:
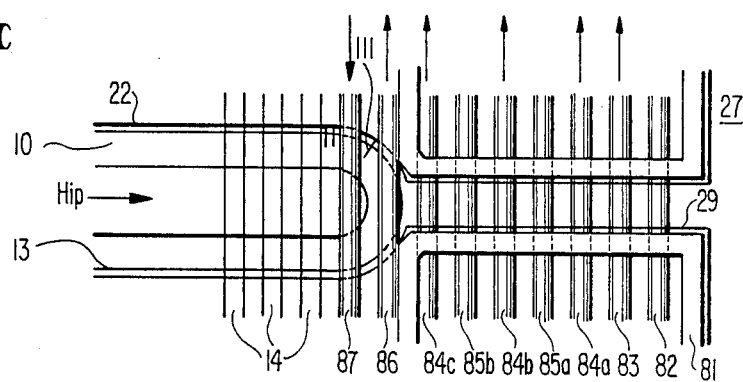

Then, currents are caused to flow through conductors 62, 64a, 66, and 67 by the read-out current source 84 (FIG. 1) in the directions by arrows in FIG. 9(c). As a result, the VBL 111 is trapped at the left side of the conductor 86 as shown in FIG. 9(c).

Thereafter, when currents are applied to U-shaped conductors 81 as shown by arrows Id and to conductor 82 by the read-out current source 85 (FIG. 1), a head portion of the endless stripe-domain 10 extends into the second connection groove 29 towards the second groove 27 of the second major line 37, in the similar manner as described above in connection with FIG. 5(d).

In the case, since the VBL 111 is restrained from movement by the current flowing through conductor 86, the magnetic domain extension 10'' has no VBL in the outside domain wall.

Therefore, even if the currents of opposite directions are applied to conductors 85a and 85b after stop of currents flowing through conductors 83 and 84a-84c, no bubble is chopped out from the magnetic domain extension 10''.

Figure 9D:
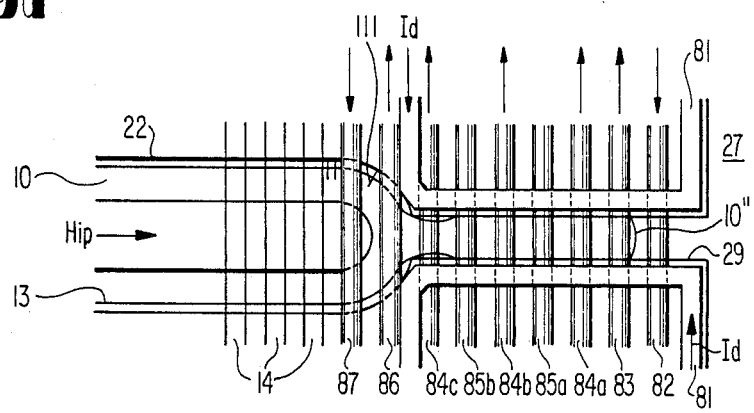
Figure 9E:
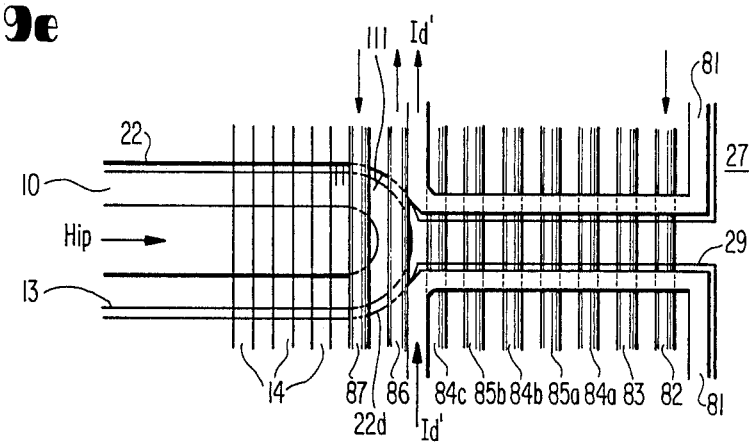

Thereafter, the direction of currents applied to U-shaped conductors 81 is reversed as indicated by arrows Id' in FIG. 9(e). As a result, the magnetic domain extension 10'' retracts into the endless groove 22, as shown in FIG. 9(e).

Figure 9F:
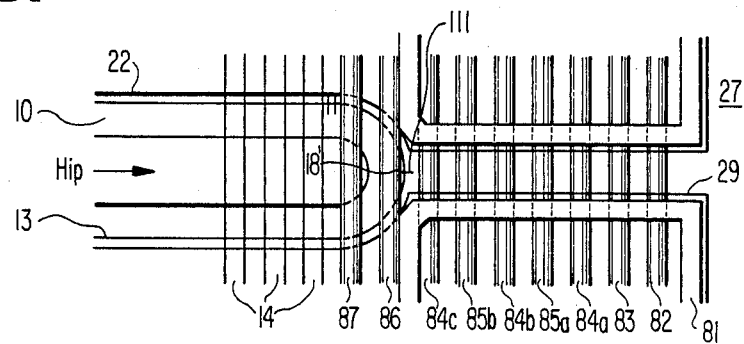

Then, the currents are stopped from flowing through conductors 81, 82, 86, and 87, so that the VBL 111 is freed from restriction by the current flowing through the conductor 86, as shown in FIG. 9(f).

Thus, when no VBL pair is in the bit position 18, no bubble is produced in the second groove 27 of the second major line 37.

Next, description is made as to another reading out operation in a case where one VBL pair exists at the bit position 17'.

Figure 10A:
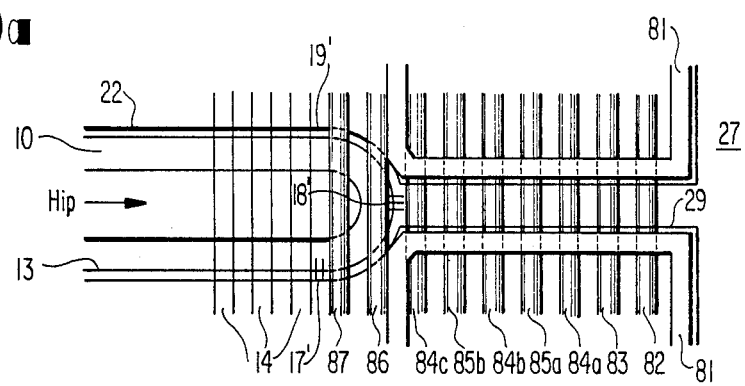
FIGS. 10a–10f are a plan view for use in describing another read-out operation of the conductor arrangement of FIG. 8.

Referring to FIG. 10(a), it is assumed that two VBL pairs exist in bit positions 17' and 18', respectively.

Figure 10B:
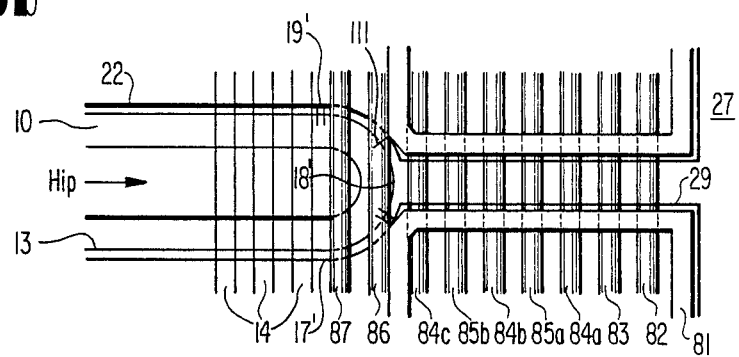

After one-bit propagation in the similar manner as in FIG. 9(b), one VBL pair is shifted from the bit position 18' to another bit position 19', while the VBL pair in the bit position 17' being shifted to the bit position 18', as shown in FIG. 10(b).

Figure 10C:
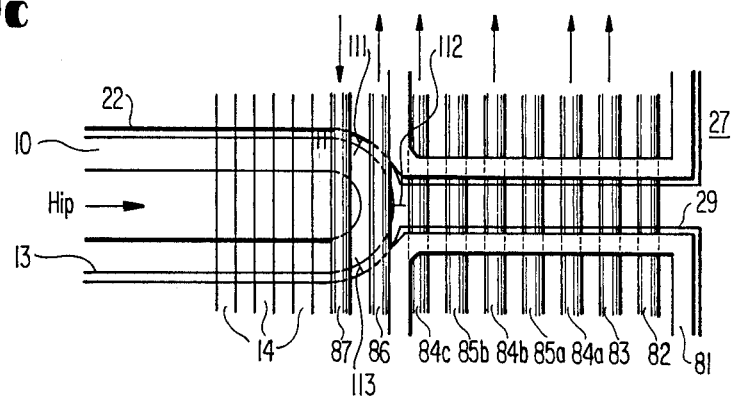

Then, currents are applied to conductors 83, 84a-84c, 85, and 86. As a result, three VBLs in the bit position 18' are separated from one another as shown at 111, 112, and 113 in FIG. 10(c), in the similar manner as described above in connection with FIG. 5(c).

Figure 10D:
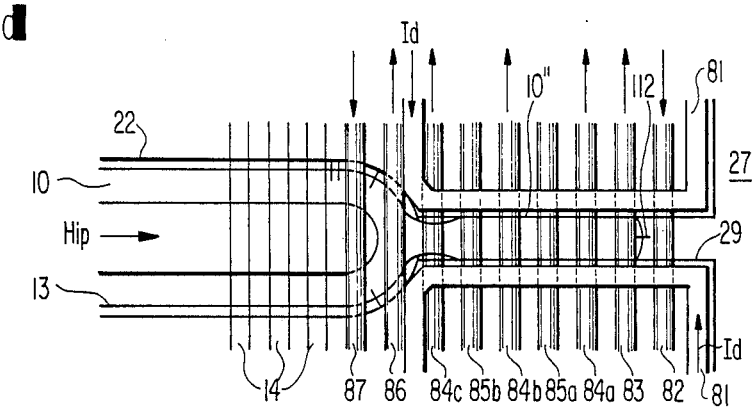

Under the condition, when currents are applied to conductors 81 as shown by arrows Id in FIG. 10(d) and to conductor 82, the head portion of the endless stripe-domain 10 extends into the second connecting groove 29 as indicated at 10″ in FIG. 10(d), in the similar manner as in FIG. 9(d).

In the condition, the VBL 112 exists in the head position of the outer domain wall of the magnetic domain extension 10″.

Figure 10E:
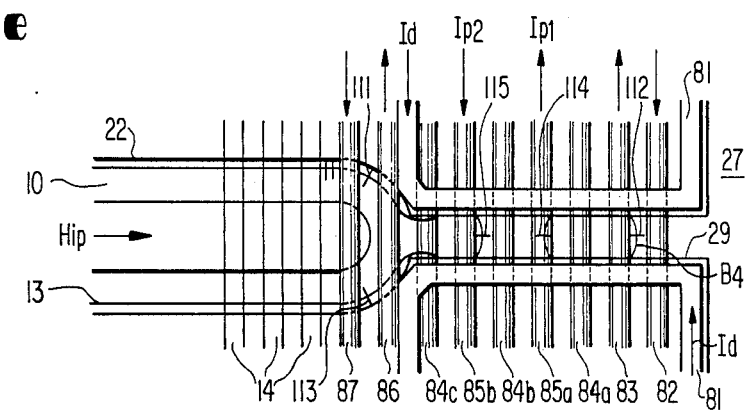

Thereafter, when currents are stopped from flowing through conductive 84a–84c and when currents $I_{p1}$ and $I_{p2}$ are applied to conductors 85a and 85b in the opposite directions, a bubble B4 is chopped out from the magnetic domain extension 10″. The bubble B4 has the VBL 112 and a fresh VBL 114, and the magnetic domain extension 10″ remaining after chopping also has a newly generated VBL 115 in its head position, as shown in FIG. 10(e).

Figure 10F:
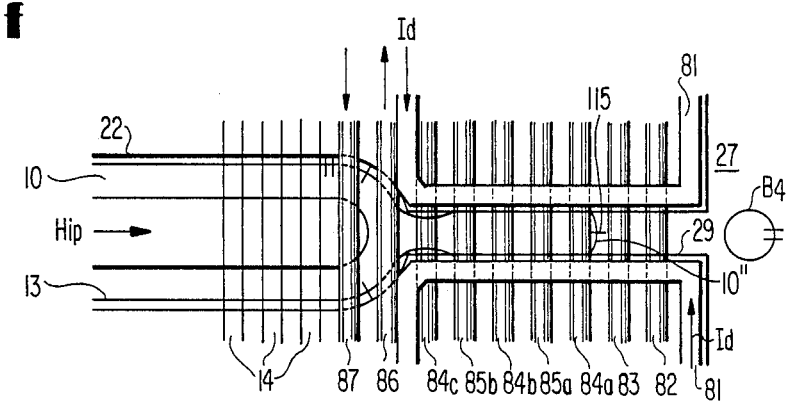

Under the circumstance, when currents are stopped from flowing through conductors 82, 83, 85a, and 85b, the bubble B4 is pushed out into the second groove 27 of the second major line 37, as shown in FIG. 10(f).

Then, the direction of current applied to U-shaped conductors 81 is reversed, so that the magnetic domain extension 10″ retracts into the semicircular groove portion 22d from the second connecting groove 29, as shown in FIG. 10(g).

The bubble B4 is transferred in the second groove 27 along the major line 37 and is detected at the bubble detector 89 (FIG. 1).

When the currents are stopped from flowing through conductors 81, 86 and 87, three VBLs comprising 111, 113 and 115 are maintained in the bit position 18′ as shown in FIG. 10(h). Thus, after one VBL pair in the bit position 18′ is read out as one bubble B4, a new VBL pair is generated in the bit position 18′. Accordingly, the non-destructive read-out operation can be performed.

As described above, since a group of conductors 61–67 is symmetric with another group of conductors 81–87, the erasing and write-in operation can be performed at the second major line 37 while the read-out operation being performed at the first major line 36. Further, the erasing, write-in and read-out operation can be performed at one of the major lines of 36 and 37.

What is claimed is:

1. In a Bloch-line memory device using a magnetic medium having a principal surface and an easy axis of magnetization orthogonal to said principal surface wherein at least one stripe-domain is generated in said magnetic medium and is surrounded by an outer domain wall in substantial parallel to said easy axis, a plurality of information signals being magnetically memorized in said domain wall as vertical Bloch line pairs, respectively, by write-in means, the memorized vertical Bloch line pairs being transferred in said domain wall by application of pulsed magnetic field in a direction orthogonal to said principal surface, and said memorized vertical Bloch line pairs being detected by detecting means to produce output signals representative of said information signals, respectively, the improvement which comprises:

at least one endless ring-like groove being formed in said principal surface of said magnetic medium to leave an island portion defined inside said endless groove so that said island portion is surrounded by an endless step portion formed at an inner boundary of said endless groove; and controllably generating means for controllably generating said stripe-domain in a form of an endless ring within said endless groove, said endless stripe-domain having an inner domain wall fixedly disposed under said endless step portion to thereby stabilize said endless stripe-domain, said endless stripe-domain being surrounded by an outer domain wall in which said vertical Bloch line pairs are written by said write-in means according to said information signals.

2. A Bloch-line memory device as claimed in claim 1, wherein said endless groove comprises a first and a second circular end portion and two intermediate portions extending in parallel with each other between said first and second circular end portions, said island portion being in a form of a stripe shape.

3. A Bloch-line memory device as claimed in claim 2, wherein said groove has a width dimension which is larger than $W_0$ but smaller than $2W_0$, $W_0$ being a width dimension of a natural stripe-domain which exists in said magnetic medium when no magnetic field is applied to said magnetic medium, said stripe-shape island portion having a width dimension larger than $W_0$.

4. A Bloch-line memory device as claimed in claim 3, wherein said controllably generating means comprises:

two groove extension portions extending from one of said first and second circular end portions on extension lines of said two intermediate portions;

first bubble generating means disposed on the other one of said first and second circular end portions for generating a magnetic bubble in the other one of said first and second circular end portions, said magnetic bubble as generated extending into said two groove extension portions through said two intermediate portions to form a generally U-shaped stripe-domain having opposite extended ends in said two groove extension portions; and second bubble generating means disposed on said two groove extension portions for generating a magnetic bubble to connect said extended ends of said U-shaped stripe-domain to each other whereby said endless stripe-domain is generated in said endless groove.

5. A Bloch-line memory device as claimed in claim 3, wherein said write-in means comprises:

a first major line groove being formed in said magnetic medium adjacent said first circular end portion and with a first space left between said first major line groove and said first circular end portion;

a first connecting groove being formed in said first space and connecting said first major line groove and said first circular end portion;

means responsive to each of said information signals for selectively disposing a magnetic bubble in said major line groove and at a predetermined position in front of said first connecting groove; and Bloch line writing means for writing a first vertical Bloch line pair into said outer domain wall through said first connecting groove only when no magnetic bubble is disposed at said predetermined position.

6. A Bloch-line memory device as claimed in claim 5, wherein said Bloch line writing means comprises:

first means including a first set of conductors disposed along said first connecting groove for controllably expanding said endless stripe-domain partially into said first connecting groove from said first circular end portion for each Bloch line writing operation and retracting the expanded domain into said first circular end portion at the end of each Bloch line writing operation; and second means including conductor means extending across said first connecting groove and for generating a Bloch line pair in an outer domain wall of said domain expanded into said first connecting groove when no bubble is disposed at said predetermined position.

7. A Bloch-line memory device as claimed in claim 6, wherein said outer domain wall has a first head portion at a position adjacent the connection of said first connecting groove and said first circular end portion, a fixed negative Bloch line previously formed and stabilized at said first head portion, said Bloch line writing means further comprising:

third means including conductor means on said first circular end portion for maintaining said fixed negative Bloch line at a position in said first circular end portion when said endless stripe-domain is partially expanded into said first connecting groove;

fourth means including conductor means extending across said first connecting groove for shifting one Bloch line of said Bloch line pair generated in an outer domain wall of said expanded domain in a position into said second circular end portion; and fifth means including conductor means extending across said first connecting groove for chopping out a magnetic bubble from said expanded domain.

8. A Bloch-line memory device as claimed in claim 5, which further comprises:

erasing means for erasing said vertical Bloch line pair from said outer domain wall through said first connecting groove.

9. A Bloch-line memory device as claimed in claim 5, which further comprises:

a second major line groove being formed in said magnetic medium adjacent said second circular end portion and with a second space left between said second major line groove and said second circular end portion;

a second connecting groove being formed in said second space and connecting said second major line groov and said second circular end portion; and said detecting means for detecting each of said vertical Bloch line pairs through said second connecting groove.

10. A Bloch-line memory device as claimed in claim 9, wherein said outer domain wall has a first head portion at a position adjacent the connection of said second connecting groove and said second circular end portion, a fixed negative Bloch line previously formed and stabilized at said first head portion, said detecting means comprising:

first means including a first set of conductors disposed along said second connecting groove for controllably expanding said endless stripe-domain partially into said second connecting groove from said second circular end portion for each Bloch line detecting operation and retracting the expanded domain into said second circular end portion at the end of each Bloch line detecting operation;

second means including conductor means on said second circular end portion for maintaining two of Bloch lines in said first head position at two positions in said second circular end portion, respectively, when said endless stripe-domain is partially expanded into said second connecting groove;

third means including conductor means extending across said second connecting groove for chopping out a magnetic bubble from said expanded domain only when one Bloch line exists in the outer domain wall of said expanded domain, said chopped magnetic bubble being pushed out into said second major line groove; and bubble detecting means for detecting bubbles in said second major line groove to produce the read-out signals.

* * * * *

UNITED STATES PATENT AND TRADEMARK OFFICE
CERTIFICATE OF CORRECTION

PATENT NO. : 4,731,752

DATED : March 15, 1988

INVENTOR(S) : Hidaka

It is certified that error appears in the above-identified patent and that said Letters Patent is hereby corrected as shown below:

COLUMN 6, LINE 52    Delete "a" and insert --at--;

COLUMN 14, LINE 4    Delete "groov" and insert --groove--.

Signed and Sealed this

Thirteenth Day of September, 1988

Attest:

DONALD J. QUIGG

*Attesting Officer*      *Commissioner of Patents and Trademarks*